United States Patent [19]

Chang et al.

[11] Patent Number: 5,438,249
[45] Date of Patent: Aug. 1, 1995

[54] METHOD OF STATE-OF CHARGE INDICATION BY MEASURING THE THICKNESS OF A BATTERY

[75] Inventors: On K. Chang; Charles A. Lung, both of San Jose, Calif.

[73] Assignee: Valence Technology, Inc., Henderson, Nev.

[21] Appl. No.: 271,247

[22] Filed: Jul. 7, 1994

Related U.S. Application Data

[63] Continuation of Ser. No. 73,208, Jun. 8, 1993, abandoned.

[51] Int. Cl.$^6$ .................................. H01M 10/48
[52] U.S. Cl. .................................. 320/15; 320/48
[58] Field of Search ............... 320/2, 5, 20, 21, 22, 320/30, 35, 43, 48; 429/90, 162

[56] References Cited

U.S. PATENT DOCUMENTS

| | | | |
|---|---|---|---|
| 3,933,526 | 1/1976 | Rackin | 136/161 |
| 4,689,544 | 8/1987 | Stadnick et al. | 320/46 |
| 4,879,190 | 11/1989 | Lundsgaard . | |
| 4,895,773 | 1/1990 | Bones et al. | 429/7 |
| 4,925,751 | 5/1990 | Shackle et al. | 429/191 |
| 4,935,317 | 6/1990 | Fauteux et al. | 429/192 |
| 4,997,732 | 3/1991 | Austin et al. | 429/153 |
| 5,011,501 | 4/1991 | Shackle et al. . | |
| 5,260,638 | 11/1993 | Hirahara | 320/46 |

*Primary Examiner*—Thomas M. Dougherty
*Assistant Examiner*—Edward Tso
*Attorney, Agent, or Firm*—Michael Ure

[57] ABSTRACT

The state of charge of a cell that has flexible packaging and that expands and contracts with variations in state of charge is determined by measuring changes in thickness of the cell. The invention is particularly applicable to cells having a flat geometry. A battery having a state-of-charge indicator includes at least one battery cell free to expand and contract with variations in state of charge of the battery cell and a device for measuring expansion or contraction of the battery cell, a resulting measurement indicating the state of charge of the battery cell. By measuring expansion or contraction of the battery the state of charge of a battery may be readily detected. The measurement may be directly displayed so as to be visually observable, or a signal containing measurement information may be sent to a remote location to be displayed or used for control purposes. Expansion or contraction of the battery may be measured in various ways, including measuring physical displacement of the cell package or measuring a change in pressure exerted upon a member as a result of the expansion or contraction of the battery.

8 Claims, 3 Drawing Sheets

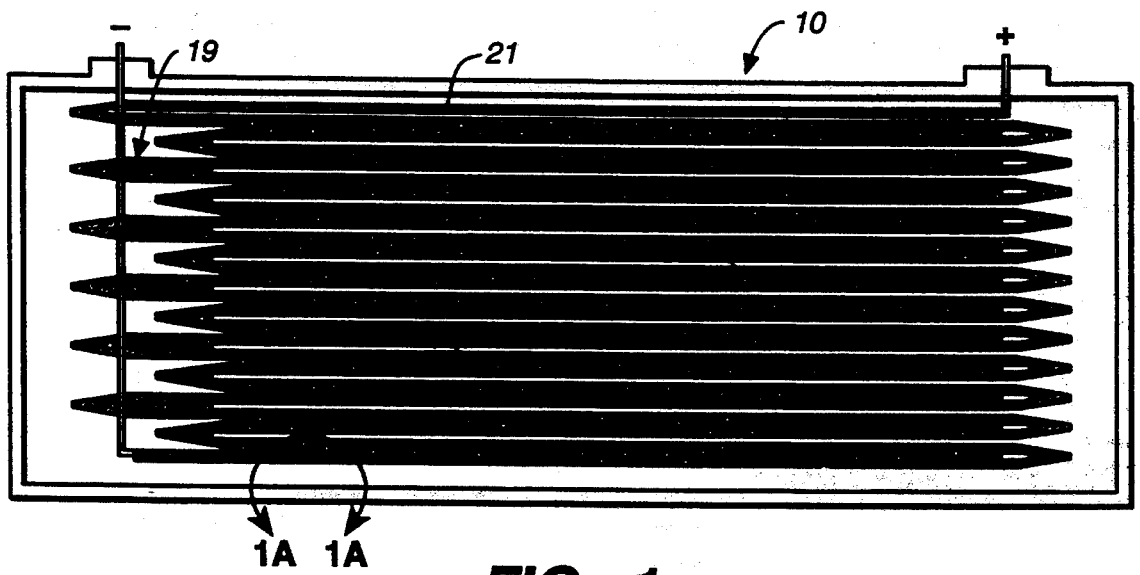
FIG._1
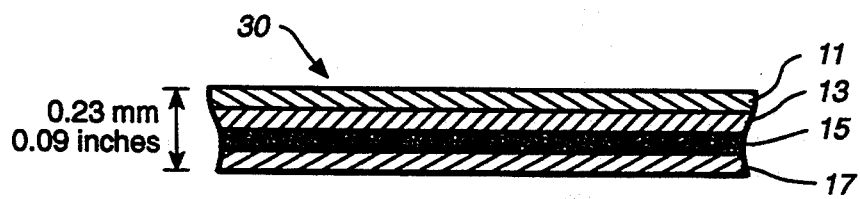
FIG._1A
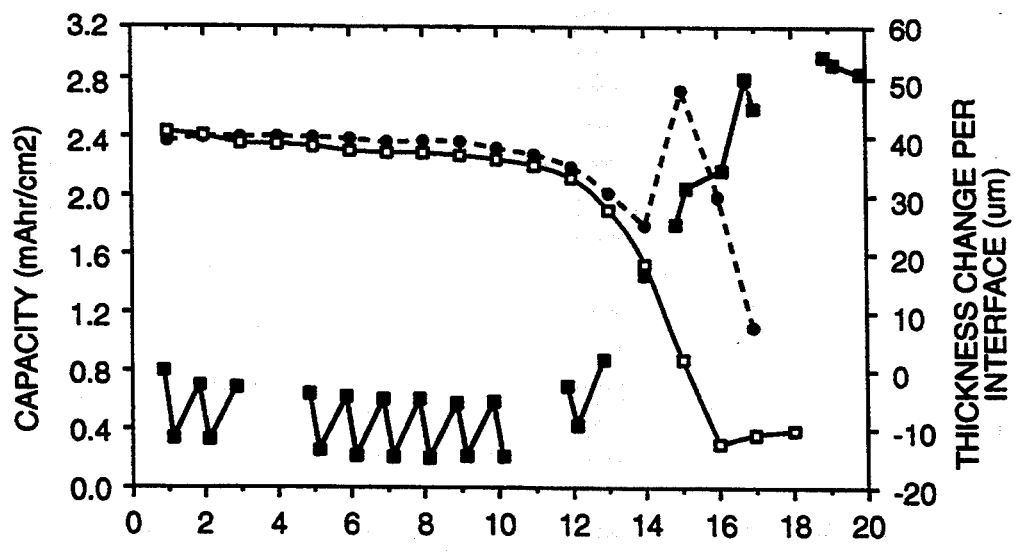
FIG._4

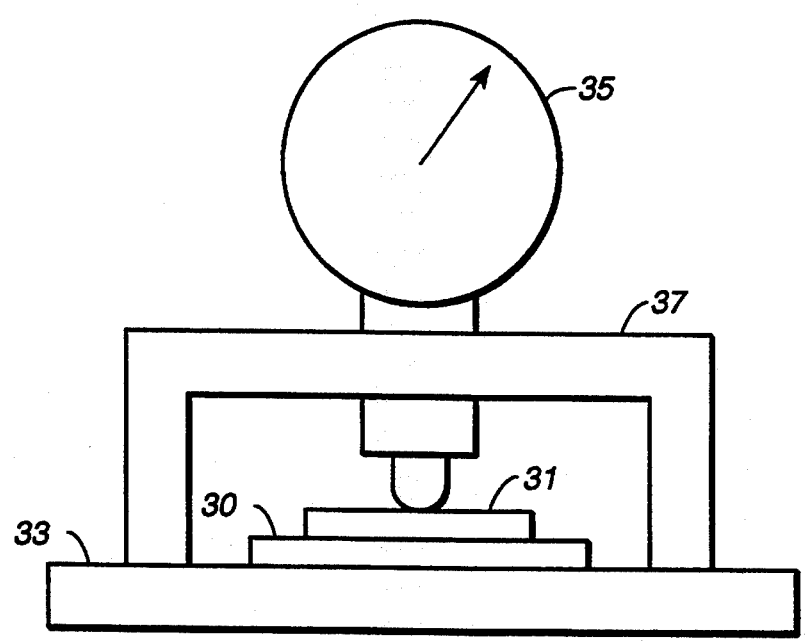
FIG._2
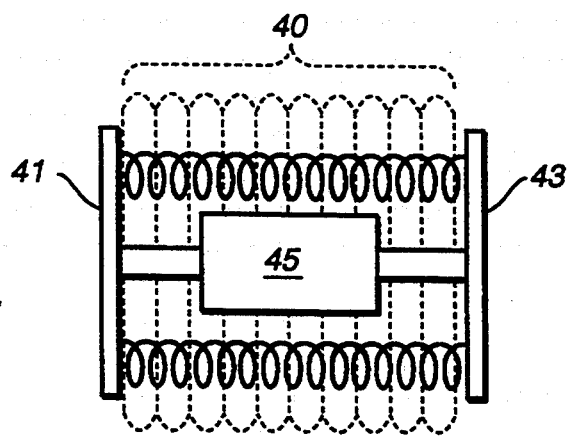
FIG._5
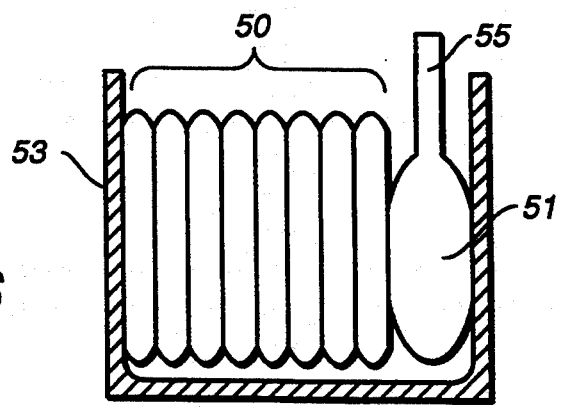
FIG._6

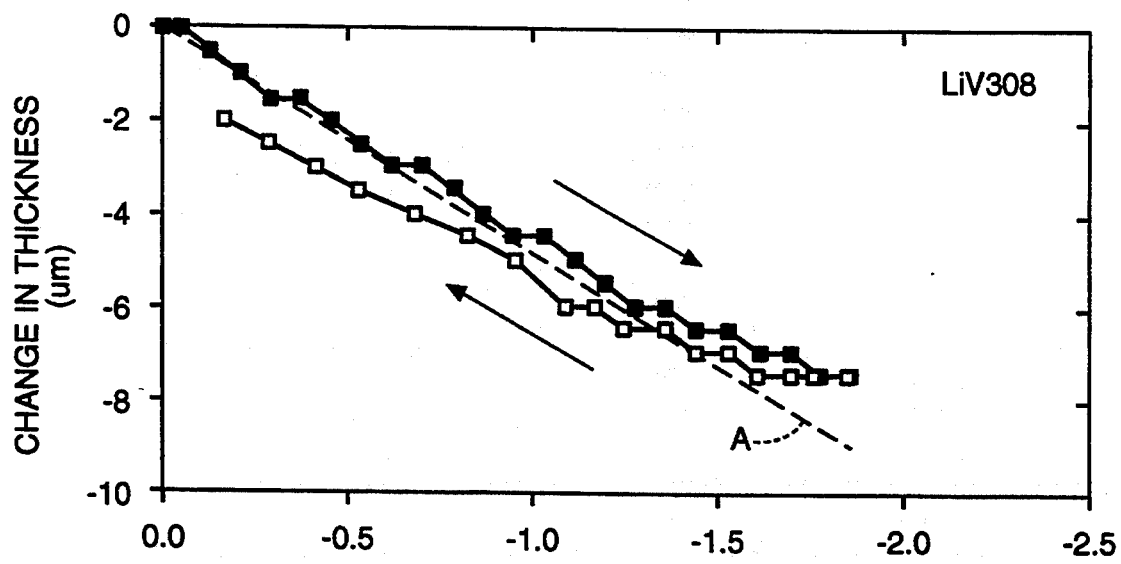
FIG._3A
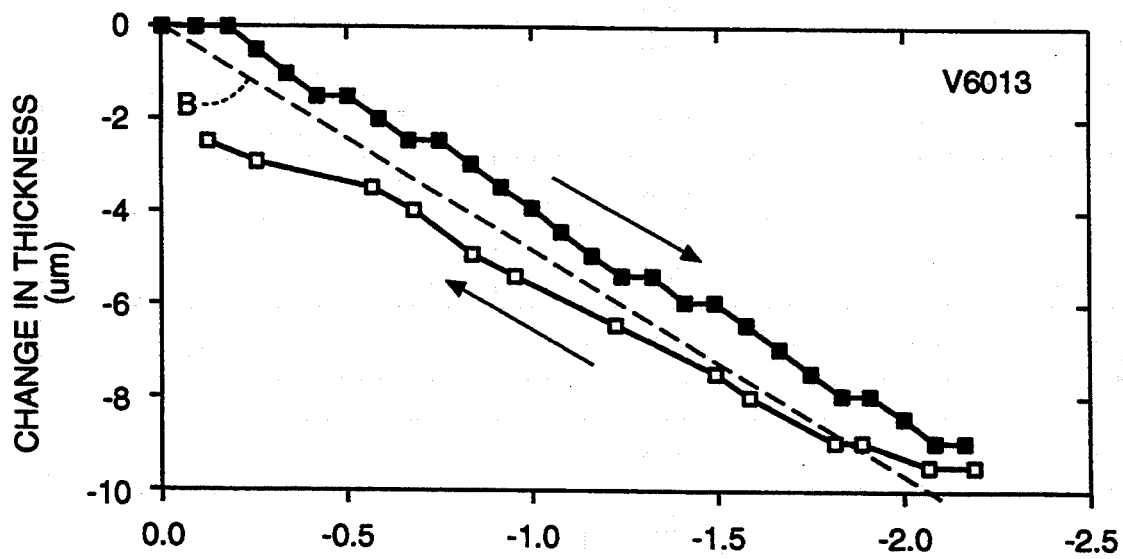
FIG._3B

METHOD OF STATE-OF CHARGE INDICATION BY MEASURING THE THICKNESS OF A BATTERY

This application is a continuation of application Ser. No. 08/073,208, filed Jun. 8, 1993 now abandoned.

BACKGROUND OF THE INVENTION

Field of the Invention

The present invention relates to determining the state of charge of a battery and more particularly to determining the state of charge at any time regardless of whether or not the battery is in use.

State of the Art

The installed base of portable equipment requiring reliable power from a primary (disposable) or secondary (rechargeable) battery is expected to grow dramatically during the next several years driven by the proliferation of such devices as the laptop computer and cellular telephone. The demand for both primary and secondary batteries for portable laptop computers is expected to triple within the next five years. During the same period, the demand for batteries for use in cellular telephones is expected to grow tenfold or more. Both for the convenience of users of battery operated equipment and to obtain the greatest service from a battery over its lifetime, the ability to determine the state of charge of a battery is extremely important. State of charge refers to the amount of usable power remaining in a battery at a particular time.

Various techniques have been used heretofore to determine the state of charge of a battery. One common way is to monitor the battery voltage. This method has several limitations. For many types of cells, the open circuit voltage of the battery either does not change with the state of charge (e.g., zinc-mercury oxide battery cell) or changes in steps (e.g., cadmium-silver oxide cell). Clearly, if the voltage is constant while the state of charge varies, voltage cannot be used as an indicator of the state of charge. Furthermore, for all types of battery cells, the voltage tinder load is affected not only by the state of charge but also by the current being drawn from the battery. Therefore, when the battery is in use, monitoring the voltage under load does not give an accurate estimate of the state of charge.

A method of estimating the residual capacity of batteries for electric vehicles is described in *Yuasa Jiho* 1992, 72, 4-12 (Japan). As described therein, the residual capacity of a battery of an electric vehicle is estimated from open circuit voltage values. The true open circuit voltage value is estimated from a regression line determined by interrupting the discharge current for a very short period of time while the vehicle is operating and carrying out a regression analysis of a subtle change in voltage during the interruption. The true open circuit voltage can also be estimated by carrying out a regression analysis of current and voltage values during operation of the vehicle. Such a method, however, is complex and requires sophisticated instruments.

For nickel hydrogen cells, the state of charge can be estimated accurately from the hydrogen pressure inside the cell. This method, however, is not applicable to any other type of cell.

What is needed, then, is a way of determining the state of charge of a cell whether the cell is in use or not.

SUMMARY OF THE INVENTION

The present invention, generally speaking, provides a way for determining the state of charge of a cell that has flexible packaging and that expands and contracts with variations in state of charge. The invention is particularly applicable to cells having a flat geometry. An example of such a cell is the lithium solid polymer battery of the present assignee.

In particular, in accordance with one embodiment of the invention, a battery having a state-of-charge indicator includes at least one battery cell free to expand and contract with variations in state of charge of the battery cell and means for measuring expansion or contraction of the battery cell, a resulting measurement indicating the state of charge of the battery cell.

In accordance with another embodiment of the invention, the state of charge of a battery is detected by measuring expansion or contraction of the battery. The measurement may be directly displayed so as to be visually observable, or a signal containing measurement information may be sent to a remote location to be displayed or used for control purposes. Expansion or contraction of the battery may be measured by various means, including measuring physical displacement of the cell package or measuring a change in pressure exerted upon a member as a result of the expansion or contraction of the cell.

BRIEF DESCRIPTION OF THE DRAWINGS

The present invention may be further understood from the following description in conjunction with the appended drawings. In the drawings:

FIG. 1 is a sectional view of a battery having flexible packaging and a flat geometry;

FIG. 2 is a diagram of an apparatus used to demonstrate the principle of the present invention;

FIG. 3a and FIG. 3b are graphs of test results obtained using the apparatus of FIG. 2;

FIG. 4 is a graph of further test results obtained using the apparatus of FIG. 2;

FIG. 5 is a diagram of one embodiment of the present invention; and

FIG. 6 is a diagram of another embodiment of the present invention.

DETAILED DESCRIPTION OF THE PREFERRED EMBODIMENTS

Referring to FIG. 1, one example of a battery having a flat geometry and flexible packaging is the lithium solid polymer battery of the present assignee. The battery 10 is composed of a lithium metal anode 11, a single phase, flexible solid polymer electrolyte 13 and a cathode 15 that stores lithium ions. Unlike the liquid electrolyte used in most batteries, the electrode 13 is a solid, which reduces weight, volume and safety problems. Cathode 15 and electrolyte 13 are coated onto a current collector 17 to form a thin sheet called a laminate. A lithium foil anode 19 is applied to the laminate 21 to form a battery cell 30. These thin cells can be folded, rolled, or stacked, depending upon the application.

The battery is manufactured in two steps. In the first step, a metal foil substrate web is transported past an extrusion head, which coats a thin film of liquid cathode material onto the metal foil. The coated substrate is then transported past an electron beam which changes the liquid cathode material into a solid polymer material. The metal foil and cathode are then transported past a second extrusion head, which coats a thin film of electrolyte material onto the solid cathode. The coated substrate is then again transported past an electron beam, changing the liquid electrolyte material into a solid polymer material. The result of these steps is a thin, multilayered sheet called the laminate. In the second step, the lithium foil anode is applied to the electrolyte layer of the laminate. The battery is then cut, folded or rolled into the desired shape and the entire battery is packaged in a vacuum sealed material. Because the battery is produced as a thin laminate, it may be shaped into a variety of forms, including very thin batteries. A large number of thin battery cells may also be connected together to form larger batteries. Further details of lithium solid polymer batteries of the type shown in FIG. 1 may be found in the following U.S. Pat. Nos., all of which are incorporated herein by reference: 4,925,751; 4,935,317; 4,997,732; 4,879,190; and 5,011,501.

Although not strictly necessary to the present invention, the battery of FIG. 1 exhibits the desirable characteristic that the state of charge of the battery is a highly linear function of the thickness of the battery. This relationship between thickness and state of charge may be verified using an apparatus of the type shown in FIG. 2. A cell is sandwiched between two rigid plates 31 and 33. The change in thickness of the cell is measured with a micrometer 35 mounted on a rigid frame 37. The thickness of two cells (in which the cathode material was $LiV_3O_8$ and $V_6O_{13}$ respectively) during charging and discharging were measured by the micrometer, which is a linear displacement gauge, mounted on the rigid frame. The resolution of the gauge was 1 um. The tip of the gauge probe was glued to the cell. The pressure of the gauge probe was about 15 kpa (2 psi). The cells were discharged at 1 mA/cm$^2$ to 1.8 V and charged at 0.25 mA/cm$^2$ to 3.0 V.

The thicknesses of the cells as a function of depth of discharge are shown in FIG. 3a ($LiV_3O_8$) and FIG. 3b ($V_6O_{13}$). The data points represent measured values of changes in cell thickness corresponding to a single cell (i.e., one cathode and one anode). The straight lines A and B are calculated changes in thickness of the lithium electrode alone. On the basis of the results, it can be concluded that the change in cell thickness is mainly from the lithium electrode.

The most likely explanation of the change in cell thickness is that, during discharge, the lithium metal anode is oxidized to lithium ions which migrate through the solid polymer to the cathode. The cathode exhibits a crystalline structure that allows the lithium ions to intercalate into the cathode. As the lithium anode undergoes ionization, the thickness of the lithium anode decreases. As the lithium ions intercalate the cathode, the thickness of the cathode increases slightly but to an extent far less than the thickness decrease of the lithium anode. An overall decrease in thickness of the cell is therefore observed. During charging of the battery, the opposite process occurs. Lithium ions are expelled from the cathode and replated onto the lithium anode, causing the overall thickness of the battery to increase.

Although the relationship between thickness and state of charge may be seen from FIGS. 3a and 3b to be substantially linear, the present invention is also applicable to batteries in which the relationship is non-linear. In such instances, the measurement may be performed electronically and linearized electronically using well known electronic techniques.

The thickness and state of charge of the battery were also monitored over a large number of cycles during which the battery was repeatedly discharged and charged. The cycling method was as follows: 1) discharge at 1 mA/cm$^2$ until voltage reaches 1.8 V; 2) hold cell at open circuit until a time 7.5 hours from the beginning of discharge; 3) charge at 0.25 mA/cm$^2$ until voltage reaches 3.0 V; 4) charge at a constant voltage of 3.0 V until a time 11 hours from the beginning of charge; 5) hold cell at open circuit for 5.5 hours.

As seen in FIG. 4, the thickness of the cell first decreases slowly with cycle number, then increases rapidly when the discharge capacity starts to drop. One possible cause of the rapid thickness increase is the formation of both gas and loose powder due to a reaction between lithium and the electrolyte.

The thickness measurements shown in FIG. 4 contain two different types of information. By taking the thickness of the battery at full charge as a reference point, the relative state of charge of the battery may be determined from the relative thickness of the battery. In addition, the relative capacity of the battery as compared to its original capacity may be determined from the thickness of the battery at full charge as compared to the original thickness of the battery at full charge. The latter information may be used to indicate when a battery may need to be replaced.

In practice, numerous different arrangements may be used to measure thickness changes of the battery. Referring to FIG. 5, in one embodiment, a cell stack 40 is sandwiched between two rigid plates 41,43 held together with springs. A linear displacement gauge 45, either mechanical or electronic, is connected between the rigid plates. The relative movement of the two plates caused by the expansion or contraction of the cells is monitored by the linear displacement gauge. The gauge reading is an indication of the state of charge of the cells.

Referring to FIG. 6, in an alternate embodiment, a stack of cells 50 and a flexible flat bag 51 filled with a liquid are packed inside a rigid box 53. The expansion of the cells causes the liquid to rise in a transparent tube 55. The level of liquid in the tube is thus an indication of the state of charge of the cells.

Numerous other arrangements may be used to measure the expansion and contraction of the cells. For example, the cells may be packed inside a semi-rigid box and a strain gauge attached to the outside of the box. Alternatively, a sliding contact may be formed on the bottom of the cell stack, so as to contact a variable resistor formed on the bottom of the inside of the rigid box. An ohm meter may then be used to produce an indication of the state of charge of the cells.

The foregoing has described the principles, preferred embodiments and modes of operation of the present invention. However, the invention should not be construed as limited to the particular embodiments discussed. Instead, the above-described embodiments should be regarded as illustrative rather restrictive, and it should be appreciated that variations may be made in those embodiments by workers skilled in the art without departing from the scope of the present invention as defined by the following claims.

What is claimed is:

1. A battery having a state of charge indicator, the combination comprising:
    flexible packaging means;

disposed within said flexible packaging means, at least one battery cell free to expand and contract with variations in state of charge of the battery cell; and means for measuring a dimensional change of the battery cell to produce a measurement value from among a continuum of measurement values, said measurement value indicating the state of charge of the battery cell.

2. The apparatus of claim 1 comprising a plurality of stacked battery cells.

3. The apparatus of claim 2, wherein said battery cells are flat.

4. The apparatus of claim 3, wherein said battery cells are lithium solid polymer battery cells.

5. The apparatus of claim 2, wherein said means for measuring measures changes in thickness of the battery cells.

6. A method of detecting the state of charge of a solid polymer battery, comprising the steps of measuring a dimensional change of the solid polymer battery to produce a measurement value from among a continuum of measurement values, said measurement value indicating the state of charge of the solid polymer battery; and displaying said measurement value.

7. A method of detecting the state of charge of a lithium solid polymer battery, comprising the step of measuring a dimensional change of the lithium solid polymer battery to produce a measurement value from among a continuum of measurement values, said measurement value indicating the state of charge of the solid polymer battery; and displaying said measurement value.

8. A battery having a state of charge indicator, the combination comprising:

flexible packaging means;

disposed within said flexible packaging means, at least one battery cell free to expand and contract with variations in state of charge of the battery cell, the battery cell having a laminate construction in which constituent sheets of a cathodic material, an electrolyte material, and an anodic material are sandwiched together; and means for measuring changes in thickness of the battery cell in a direction perpendicular to said constituent sheets to produce a measurement value from among a continuum of measurement values, said measurement value indicating the state of charge of the battery cell.

* * * * *